(12) United States Patent
Shoji et al.

(10) Patent No.: US 9,907,192 B2
(45) Date of Patent: Feb. 27, 2018

(54) ELECTRONIC APPARATUS

(71) Applicant: FUJITSU LIMITED, Kawasaki-shi, Kanagawa (JP)

(72) Inventors: Hiromu Shoji, Kawasaki (JP); Tsubasa Hashimoto, Kita (JP); Hiroshi Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/432,765

(22) Filed: Feb. 14, 2017

(65) Prior Publication Data

US 2017/0290173 A1    Oct. 5, 2017

(30) Foreign Application Priority Data

Mar. 31, 2016 (JP) .................... 2016-071736

(51) Int. Cl.
| | |
|---|---|
| H01J 5/00 | (2006.01) |
| H01J 15/00 | (2006.01) |
| H05K 5/06 | (2006.01) |
| H05K 7/14 | (2006.01) |
| H05K 7/16 | (2006.01) |
| H05K 5/00 | (2006.01) |
| H05K 7/20 | (2006.01) |
| H05K 5/03 | (2006.01) |
| H05K 5/02 | (2006.01) |

(52) U.S. Cl.
CPC .......... *H05K 5/0008* (2013.01); *H05K 5/0247* (2013.01); *H05K 5/03* (2013.01); *H05K 7/20418* (2013.01); *H05K 5/061* (2013.01)

(58) Field of Classification Search
CPC ........ H05K 5/0247; H05K 5/03; H05K 5/061; H05K 7/1076; H05K 7/1462; H05K 7/1489; H05K 7/20418; H01R 13/6608; H02G 3/14; H02G 3/16
USPC ...... 174/50.54, 53, 535, 541, 542, 559, 561, 174/563
See application file for complete search history.

(56) References Cited

U.S. PATENT DOCUMENTS

| | | | | |
|---|---|---|---|---|
| 5,175,613 | A * | 12/1992 | Barker, III | ............... H01L 23/32 257/659 |
| 5,408,128 | A * | 4/1995 | Furnival | ........... H01L 23/49811 257/690 |
| 2006/0105626 | A1* | 5/2006 | Scott | .................... H01R 9/2491 439/535 |
| 2010/0091477 | A1* | 4/2010 | Takagi | .................. H01L 23/057 257/E21.001 |

(Continued)

FOREIGN PATENT DOCUMENTS

| | | |
|---|---|---|
| JP | 2006-216724 A | 8/2006 |
| JP | 2008-244185 A | 10/2008 |

*Primary Examiner* — Chau N Nguyen
*Assistant Examiner* — Roshn Varghese
(74) *Attorney, Agent, or Firm* — Arent Fox LLP (57) ABSTRACT

An electronic apparatus includes a housing that houses an electronic component, and a first cover and a second cover that cover the housing, wherein the electronic component is oriented along and on an inner side of a first sidewall of the first cover, wherein a side surface of the electronic component that faces the first sidewall has a cut, wherein the first cover has a recess that is depressed from the first sidewall toward the inner side in such a manner as to conform to the cut, and wherein the first cover is fastened at the recess to the second cover with a fastening member.

4 Claims, 12 Drawing Sheets

(56) References Cited

U.S. PATENT DOCUMENTS

2013/0176664 A1* 7/2013 Ikezawa .............. H05K 5/0239
361/679.01
2014/0361424 A1* 12/2014 Horio .................. H02M 7/003
257/704

* cited by examiner

ELECTRONIC APPARATUS

CROSS-REFERENCE TO RELATED APPLICATION

This application is based upon and claims the benefit of priority of the prior Japanese Patent Application No. 2016-071736, filed on Mar. 31, 2016, the entire contents of which are incorporated herein by reference.

FIELD

The embodiment discussed herein is related to an electronic apparatus.

BACKGROUND

There is an exemplary technique of reducing the size of a base station for radio communications by providing a door that opens and closes a plurality of faces of a housing body, and a door pocket that receives the door, when opened, in such a manner as to draw the door into the housing body (see Japanese Laid-open Patent Publication No. 2008-244185, for example).

There is another exemplary technique of reducing the size of an electronic apparatus by fastening a first housing and a second housing, which together form a housing, to each other by fitting a tab of the first housing into a holding recess of the second housing (see Japanese Laid-open Patent Publication No. 2006-216724, for example).

SUMMARY

According to an aspect of the invention, an electronic apparatus includes a housing that houses an electronic component, and a first cover and a second cover that cover the housing, wherein the electronic component is oriented along and on an inner side of a first sidewall of the first cover, wherein a side surface of the electronic component that faces the first sidewall has a cut, wherein the first cover has a recess that is depressed from the first sidewall toward the inner side in such a manner as to conform to the cut, and wherein the first cover is fastened at the recess to the second cover with a fastening member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Electronic apparatuses such as the base station and the like described above have reduced sizes and are therefore installable in sites where other known electronic apparatuses are not installable. Consequently, more options of installation sites are provided, and such electronic apparatuses are more widely usable. Hence, there are demands for much smaller electronic apparatuses. Accordingly, an aspect is to reduce the sizes of electronic apparatuses.

First, an electronic apparatus 5 used as a base station for radio communications will be described.

Figure 1:
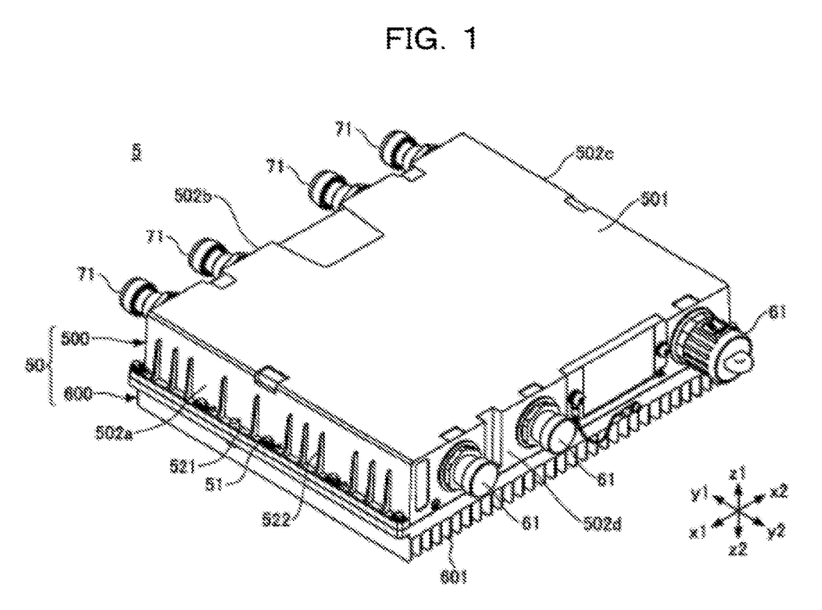
FIG. 1 is a perspective view of an electronic apparatus.
Figure 2A:
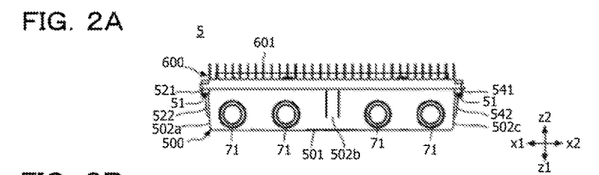
FIGS. 2A, 2B, and 2C are a rear view, a top view, and a side view, respectively, of the electronic apparatus.
Figure 2B:
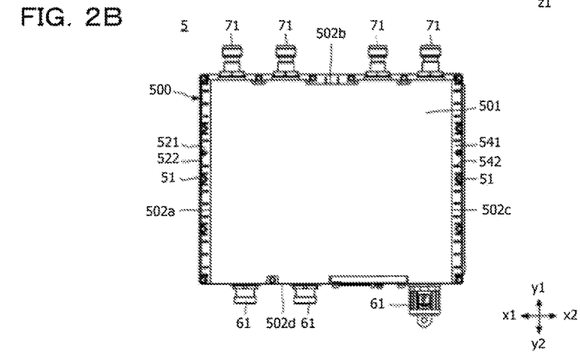
Figure 2C:
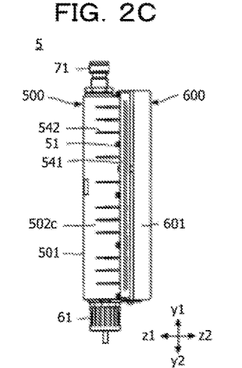
Figure 3:
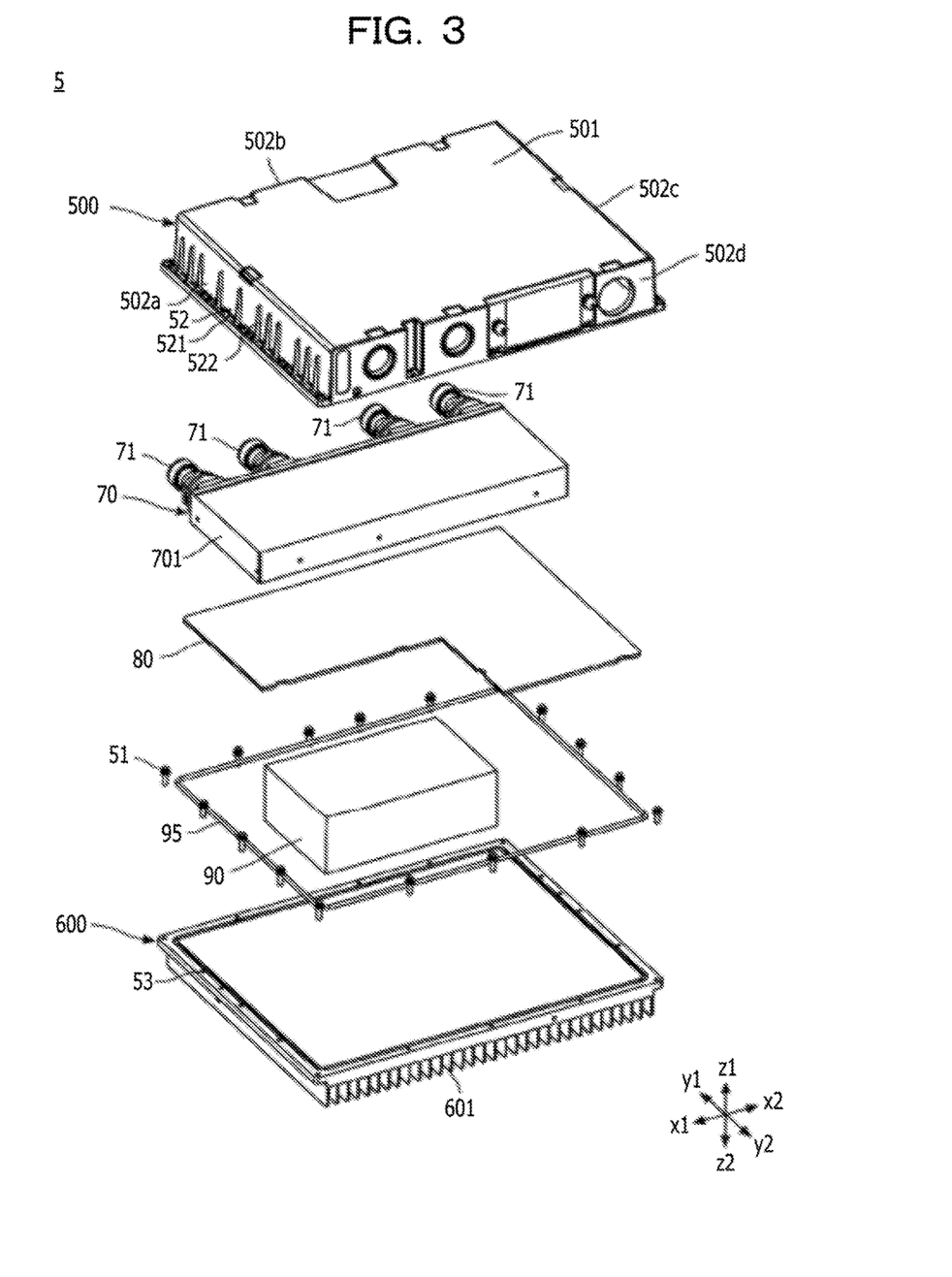
FIG. 3 is an exploded perspective view of the electronic apparatus.

FIG. 1 is a perspective view of the electronic apparatus 5. FIG. 2A is a rear view of the electronic apparatus 5. FIG. 2B is a top view of the electronic apparatus 5. FIG. 2C is a side view of the electronic apparatus 5. FIG. 3 is an exploded perspective view of the electronic apparatus 5. In FIGS. 1 to 4, the x1-x2 direction corresponds to the width direction of the electronic apparatus 5, the y1-y2 direction corresponds to the depth direction of the electronic apparatus 5, and the z1-z2 direction corresponds to the height direction of the electronic apparatus 5.

As illustrated in FIG. 1, the electronic apparatus 5 includes a housing 50 that houses electronic components provided between a cover portion 500 and a base portion 600 thereof.

The cover portion 500 has a box shape whose side that is nearest to the base portion 600 is open. The cover portion 500 includes a top wall 501, a first sidewall 502a, a second sidewall 502b, a third sidewall 502c, and a fourth sidewall 502d. The first sidewall 502a, the second sidewall 502b, the third sidewall 502c, and the fourth sidewall 502d are provided on the respective sides of the top wall 501, which has a rectangular shape, and each extend perpendicularly to the top wall 501.

Hereinafter, in the z1-z2 direction, the side on which the cover portion 500 is provided is occasionally referred to as the upper side, and the side on which the base portion 600 is provided is occasionally referred to as the lower side. Furthermore, in the x1-x2 direction, the side on which the first sidewall 502a of the cover portion 500 is provided is occasionally referred to as the left side, and the side on which the third sidewall 502c is provided is occasionally referred to as the right side.

The fourth sidewall 502d of the cover portion 500 is provided with a plurality of connectors 61. The second sidewall 502b of the cover portion 500 is provided with a plurality of connectors 71. The connectors 61 and the connectors 71 are connected to the electronic components housed in the housing 50.

The cover portion 500 includes a first flange 521 that projects in the x1 direction from the lower end of the first sidewall 502a. The first flange 521 is laid over the peripheral edge of the base portion 600 and is fastened to the base portion 600 with a plurality of screws 51.

The cover portion 500 further includes a second flange 541 that projects in the x2 direction from the lower end of the third sidewall 502c. The second flange 541 is laid over the peripheral edge of the base portion 600 and is fastened to the base portion 600 with a plurality of screws 51.

The first sidewall 502a of the cover portion 500 has a plurality of ribs 522 that increase the strength thereof. Likewise, the third sidewall 502c of the cover portion 500 has a plurality of ribs 542.

The base portion 600 has a plurality of heat-radiating fins 601 on the lower side thereof and thus radiates heat generated from the electronic components housed in the housing 50.

Referring to FIG. 3, a duplexer 70, a substrate 80, and a power-source unit 90 are provided between the cover portion 500 and the base portion 600. The space between the cover portion 500 and the base portion 600 is sealed with a gasket 95.

The duplexer 70 is an electronic component that electrically separates a signal-transmitting line and a signal-receiving line from each other so that the transmission and reception of signals can be performed with one antenna. The duplexer 70 includes a rectangular-parallelepiped body 701, in which elements such as a filter that filters signals to be transmitted or signals received are provided. The body 701 of the duplexer 70 is provided on the rear side thereof in FIG. 3 with the connectors 71.

The duplexer 70 is oriented in the housing 50 such that the left and right sidewalls of the body 701 extend along the first sidewall 502a and the third sidewall 502c, respectively, of the cover portion 500.

The plurality of electronic components are mounted on the lower surface of the substrate 80, and the substrate 80 is fixed to the upper surface of the base portion 600. The power-source unit 90 is fixed to the upper surface of the base portion 600 and supplies power to the electronic components and so forth mounted on the substrate 80.

The cover portion 500 having the duplexer 70 attached thereto with the connectors 71 extending through respective openings provided in the second sidewall 502b is fastened to the base portion 600 on which the substrate 80 and the power-source unit 90 are mounted.

Figure 4:
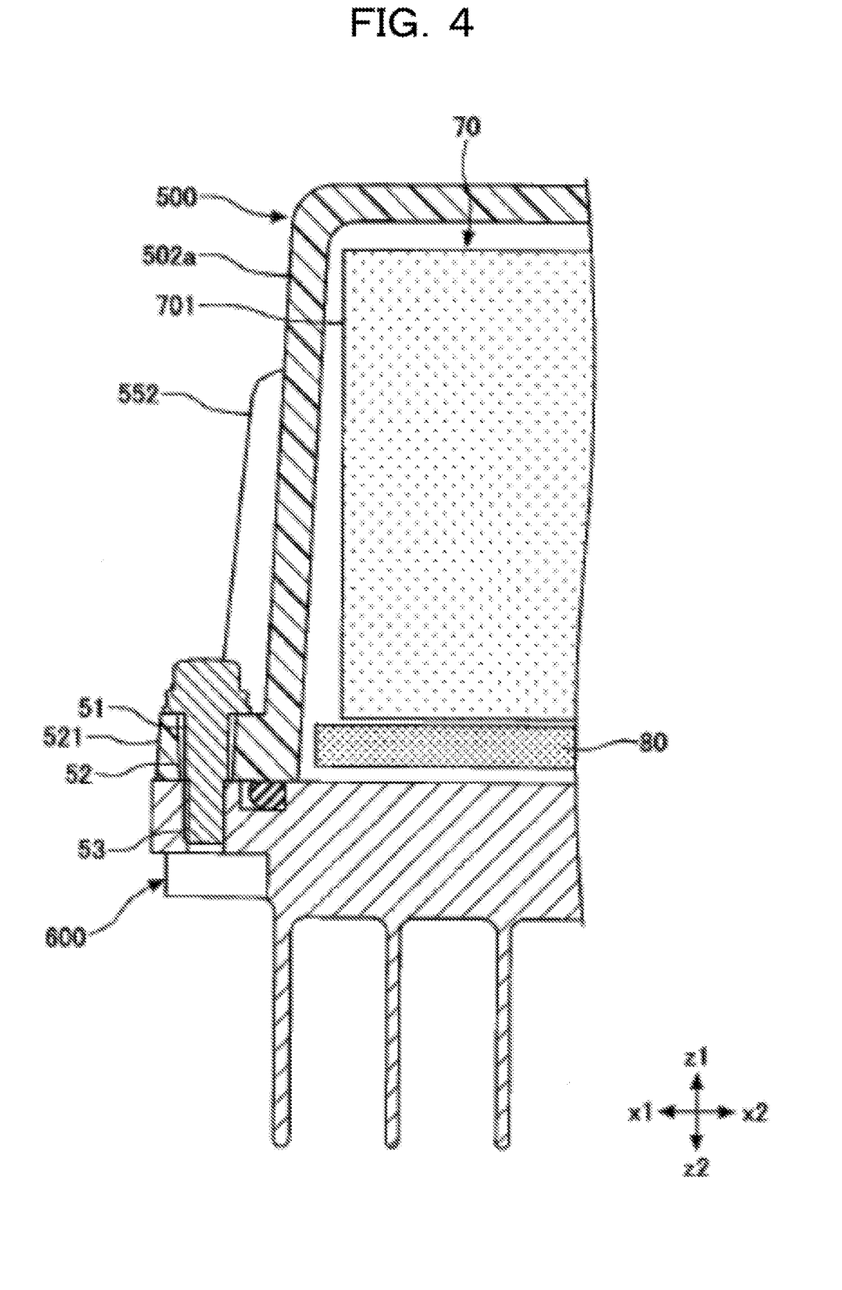
FIG. 4 is a sectional view of a part of the electronic apparatus.

FIG. 4 is a sectional view of a part of the electronic apparatus 5 and illustrates an x-z section containing the first flange 521.

As illustrated in FIG. 4, the cover portion 500 is fastened to the base portion 600 with the screws 51 at the first flange 521 thereof that is laid over the peripheral edge of the base portion 600. The screws 51 are inserted into respective insertion holes 52 provided in the first flange 521 and are screwed into respective screw holes 53 provided in the base portion 600, whereby the cover portion 500 is fastened to the base portion 600.

The electronic apparatus 5 includes the first flange 521 and the second flange 541 projecting on the outside of the housing 50 so that the cover portion 500 can be fastened to the base portion 600. If the first flange 521 and the second flange 541 projecting as described above can be omitted, the width of the housing 50 can be reduced, leading to a size reduction of the electronic apparatus 5.

Now, an electronic apparatus 1 according to an embodiment will be described with reference to FIGS. 5 to 12, wherein like reference numerals denote like elements, and redundant description of such elements is omitted according to need.

Figure 5:
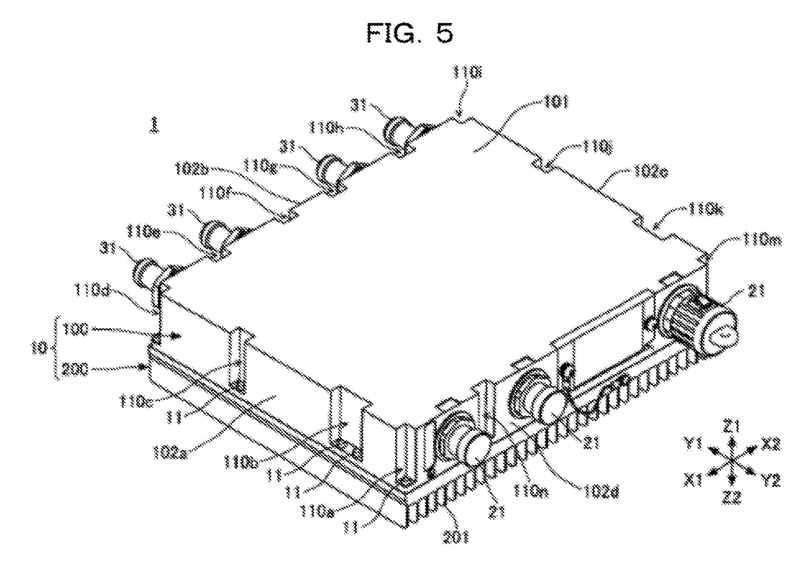
FIG. 5 is a perspective view of an electronic apparatus according to an embodiment.
Figure 6A:
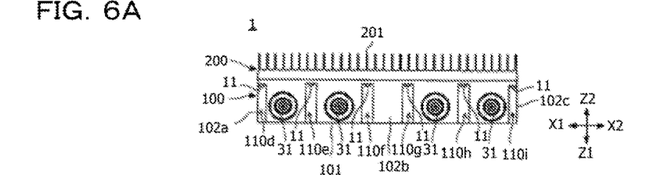
FIGS. 6A, 6B, and 6C are a rear view, a top view, and a side view, respectively, of the electronic apparatus according to the embodiment.
Figure 6B:
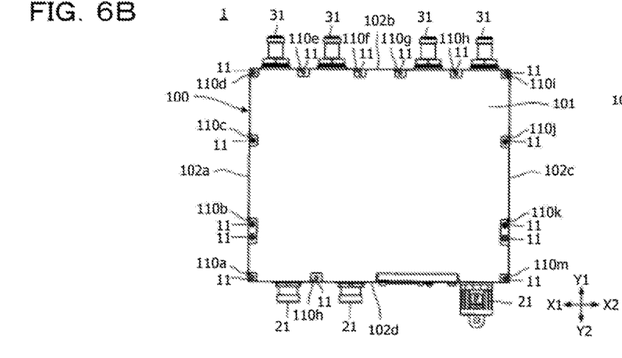
Figure 6C:
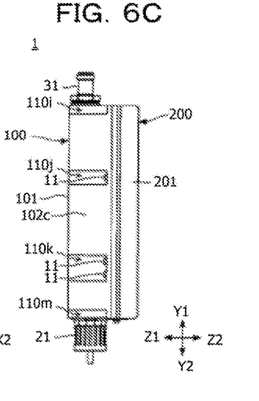

FIG. 5 is a perspective view of the electronic apparatus 1 according to the embodiment. FIG. 6A is a rear view of the electronic apparatus 1 according to the embodiment. FIG. 6B is a top view of the electronic apparatus 1. FIG. 6C is a side view of the electronic apparatus 1. In FIGS. 5 to 12, the X1-X2 direction corresponds to the width direction of the electronic apparatus 1, the Y1-Y2 direction corresponds to the depth direction of the electronic apparatus 1, and the Z1-Z2 direction corresponds to the height direction of the electronic apparatus 1.

The electronic apparatus 1 according to the embodiment is a base station for radio communications and is installed outdoor. Note that the application of the embodiment is not limited to the base station. The embodiment is applicable to any electronic apparatus including a housing that houses electronic components.

As illustrated in FIG. 5, the electronic apparatus 1 includes a housing 10 that houses electronic components provided between a cover portion 100 and a base portion 200 thereof.

The cover portion 100 is made of, for example, resin such as polycarbonate and has a box shape whose side that is nearest to the base portion 200 is open. The cover portion 100 includes a top wall 101, a first sidewall 102a, a second sidewall 102b, a third sidewall 102c, and a fourth sidewall 102d. The first sidewall 102a, the second sidewall 102b, the third sidewall 102c, and the fourth sidewall 102d are provided on the respective sides of the top wall 101, which has a rectangular shape, and each extend perpendicularly to the top wall 101. The first sidewall 102a and the third sidewall 102c face each other in the X1-X2 direction. The second sidewall 102b and the fourth sidewall 102d face each other in the Y1-Y2 direction.

Hereinafter, in the Z1-Z2 direction, the side on which the cover portion 100 is provided is occasionally referred to as the upper side, and the side on which the base portion 200 is provided is occasionally referred to as the lower side. Furthermore, in the X1-X2 direction, the side on which the first sidewall 102a of the cover portion 100 is provided is occasionally referred to as the left side, and the side on which the third sidewall 102c is provided is occasionally referred to as the right side.

The fourth sidewall 102d of the cover portion 100 is provided with a plurality of connectors 21. The second sidewall 102b is provided with a plurality of connectors 31. The connectors 21 and the connectors 31 are connected to the electronic components housed in the housing 10.

The cover portion 100 has recesses 110a, 110d, 110i, and 110m at the four respective corners thereof. The first sidewall 102a has recesses 110b and 110c. The second sidewall 102b has recesses 110e, 110f, 110g, and 110h. The third sidewall 102c has recesses 110j and 110k. The fourth sidewall 102d has a recess 110n.

In the following description, the first sidewall 102a, the second sidewall 102b, the third sidewall 102c, and the fourth sidewall 102d are also collectively referred to as "sidewalls 102", and the recesses 110a to 110n are also collectively referred to as "recesses 110".

Figure 7A:
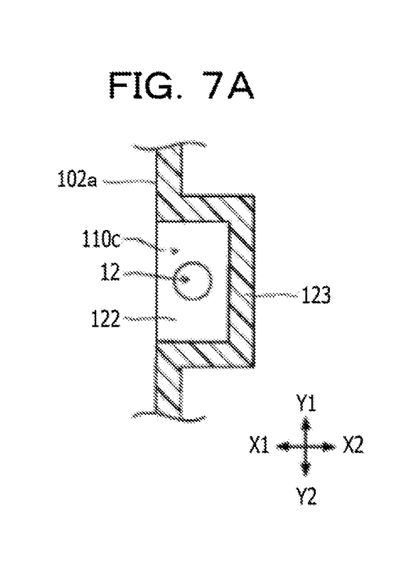
FIGS. 7A and 7B are sectional views of a recess according to the embodiment.
Figure 7B:
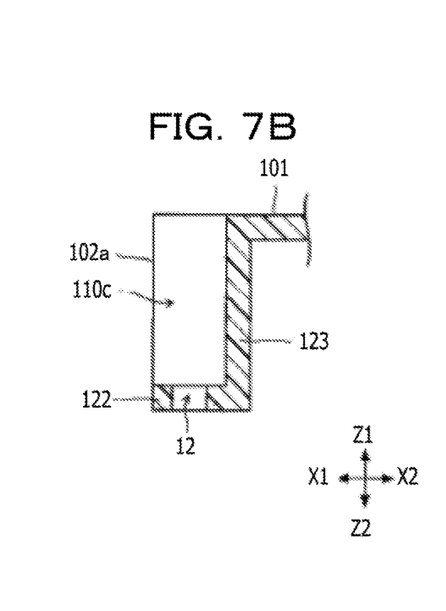

FIGS. 7A and 7B are sectional views of the recess 110c provided in the first sidewall 102a of the cover portion 100. FIG. 7A illustrates an X-Y section of the recess 110c. FIG. 7B illustrates an X-Z section of the recess 110c.

As illustrated in FIGS. 7A and 7B, the recess 110c includes a bottom wall 122, which is fastened to the base portion 200, and a peripheral wall 123 surrounding the bottom wall 122.

The bottom wall 122 extends from the first sidewall 102a toward the inner side of the cover portion 100 in such a manner as to project in the X2 direction. The bottom wall 122 has an insertion hole 12 into which a screw 11 that fastens the cover portion 100 to the base portion 200 is inserted.

The peripheral wall 123 extends perpendicularly to the bottom wall 122 in such a manner as to connect the peripheral edge of the bottom wall 122 to the top wall 101. The insertion hole 12 provided in the recess 110c extends in the Z1 direction. Therefore, the cover portion 100 can be fastened to the base portion 200 by inserting the screw 11 into the insertion hole 12 of the bottom wall 122 and rotating the screws 11 with a tool.

While the recess 110c provided in the first sidewall 102a is taken as an example herein, the other recesses 110 provided in the cover portion 100 also have the same shape as the recess 110c and are depressed from the respective sidewalls 102 toward the inner side of the cover portion 100. As illustrated in FIGS. 5 and 6A to 6C, the cover portion 100 is fastened to the base portion 200 with the screws 11 at the recesses 110 provided in the sidewalls 102.

Figure 8:
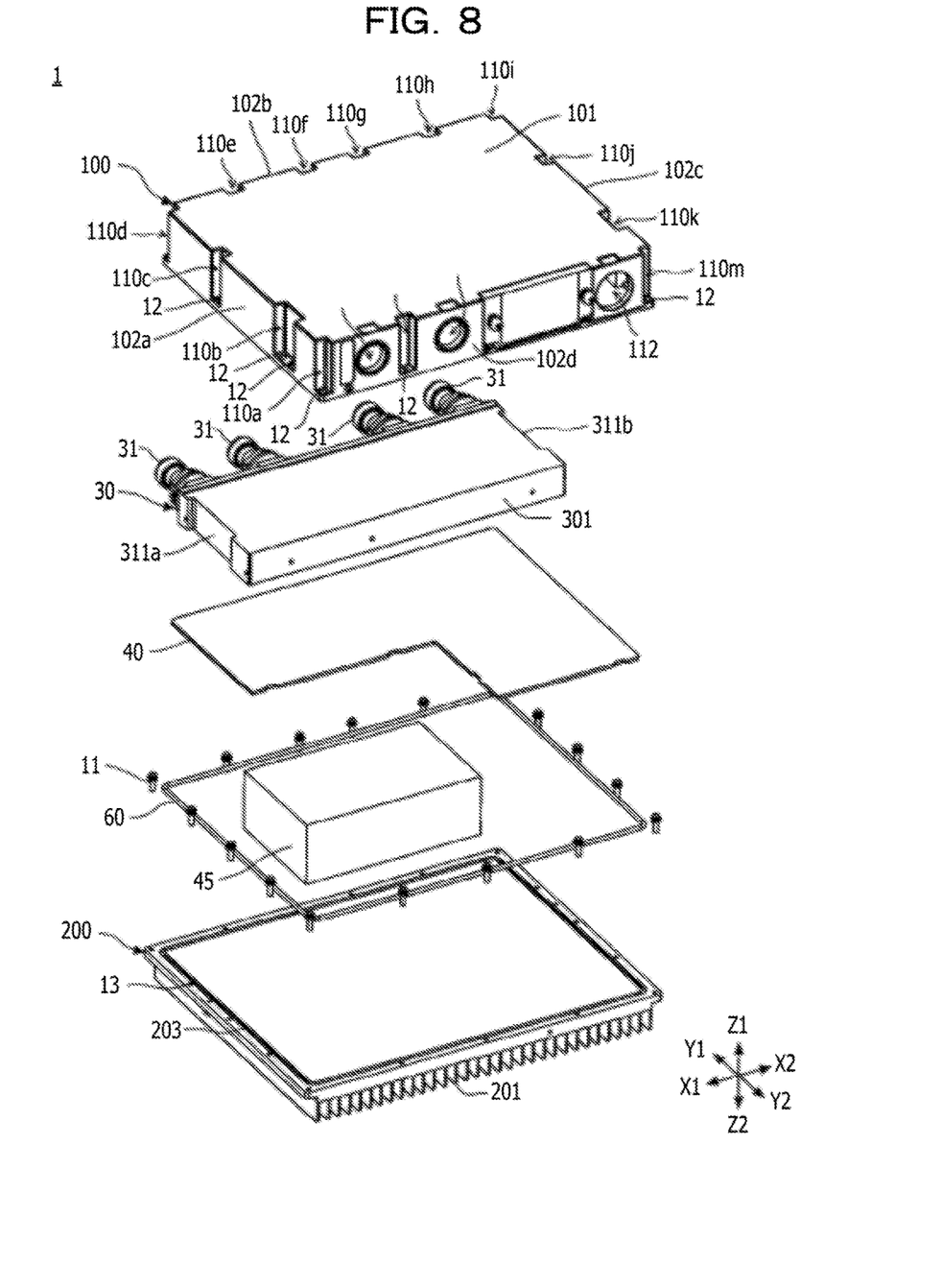
FIG. 8 is an exploded perspective view of the electronic apparatus according to the embodiment.

FIG. 8 is an exploded perspective view of the electronic apparatus 1 according to the embodiment. As illustrated in FIG. 8, the electronic apparatus 1 includes a duplexer 30, a substrate 40, a power-source unit 45, and so forth that are provided between the cover portion 100 and the base portion 200.

The fourth sidewall 102d of the cover portion 100 has openings 112 into which the connectors 21 illustrated in FIGS. 5 and 6A to 6C are fitted, respectively. Furthermore, the recesses 110 in the sidewalls 102 have the insertion holes 12 into which the screws 11 are inserted, respectively.

The base portion 200 is made of, for example, aluminum and serves as a heat sink having a plurality of heat-radiating fins 201 on the lower side thereof. The base portion 200 radiates heat generated from the electronic components provided between the base portion 200 and the cover portion 100.

The base portion 200 has at the periphery thereof a gasket groove 203 into which a gasket 60 as a seal member is fitted. Furthermore, the base portion 200 has screw holes 13 on the outer peripheral side of the gasket groove 203. The screws 11 with which the cover portion 100 is fastened to the base portion 200 are screwed into the screw holes 13, respectively.

The screws 11 are inserted into the insertion holes 12 provided in the recesses 110 of the cover portion 100 and are screwed into the screw holes 13 provided in the base portion 200, whereby the cover portion 100 is fastened to the base portion 200. Alternatively, the cover portion 100 and the base portion 200 may be fastened to each other with bolts and nuts or other like members.

The gasket 60 is made of an elastic material such as rubber. The gasket 60 is fitted into the gasket groove 203 of the base portion 200 and thus seals the gap between the cover portion 100 and the base portion 200. Since the gasket 60 seals the gap between the cover portion 100 and the base portion 200, the entry of rain drops, dust particles, or other foreign substances from the outside to the inside of the housing 10 is suppressed.

The plurality of electronic components are mounted on the lower surface of the substrate 40 that is positioned between the cover portion 100 and the base portion 200, and the substrate 40 is fixed to the upper surface of the base portion 200. The power-source unit 45 is fixed to the upper surface of the base portion 200 and supplies power to the electronic components and so forth mounted on the substrate 40.

The duplexer 30 is an electronic component that electrically separates a signal-transmitting line and a signal-receiving line from each other so that the transmission and reception of signals can be performed with one antenna.

Figure 9:
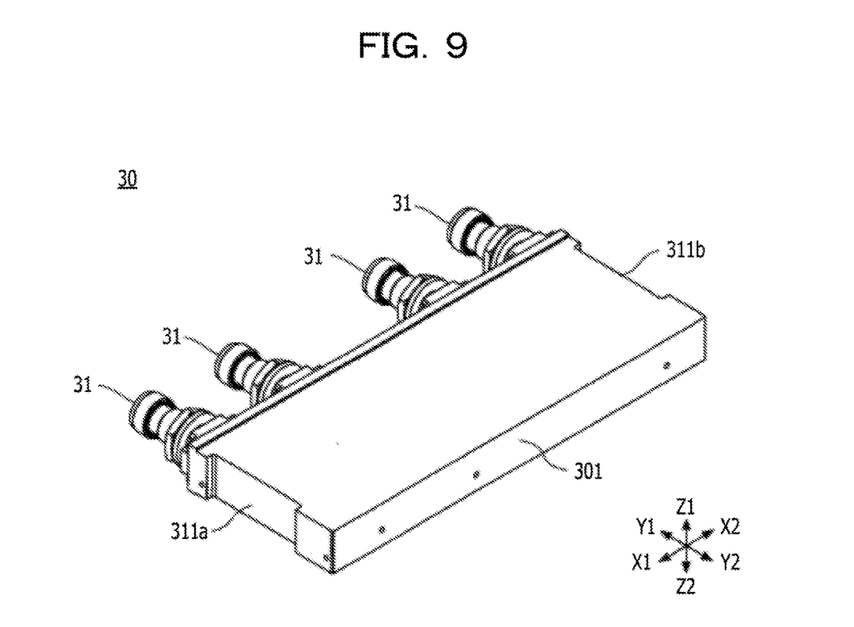
FIG. 9 is a perspective view of a duplexer according to the embodiment.
Figure 10A:
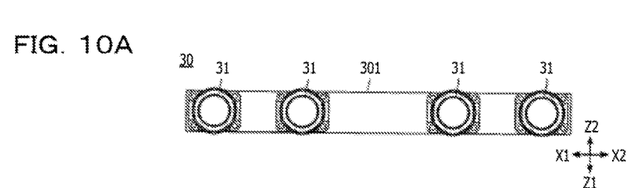
FIGS. 10A, 10B, and 10C are a rear view, a top view, and a side view, respectively, of the duplexer according to the embodiment.
Figure 10B:
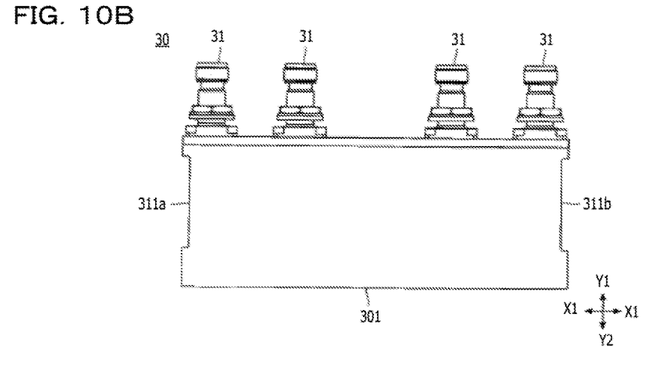
Figure 10C:
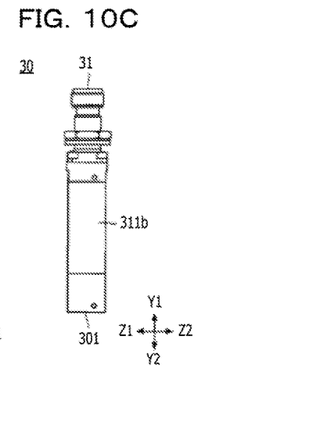

FIG. 9 is a perspective view of the duplexer 30 according to the embodiment. FIG. 10A is a rear view of the duplexer 30 according to the embodiment. FIG. 10B is a top view of the duplexer 30. FIG. 10C is a side view of the duplexer 30.

The duplexer 30 includes a rectangular-parallelepiped body 301, in which elements such as a filter that filters signals to be transmitted or signals received are provided. The body 301 of the duplexer 30 is provided on the rear side thereof with the plurality of connectors 31 that are to be connected to antennas or the like. The connectors 31 are inserted into respective openings provided in the second sidewall 102b of the cover portion 100, thereby projecting to the outside. The body 301 of the duplexer 30 has a cut 311a on the left side thereof and a cut 311b on the right side thereof.

The duplexer 30 is positioned inside the housing 10, with the connectors 31 extending through the respective openings provided in the second sidewall 102b of the cover portion 100. The duplexer 30 is oriented in the housing 10 such that the left and right sidewalls of the body 301 extend along the first sidewall 102a and the third sidewall 102c, respectively, of the cover portion 100.

Figure 11A:
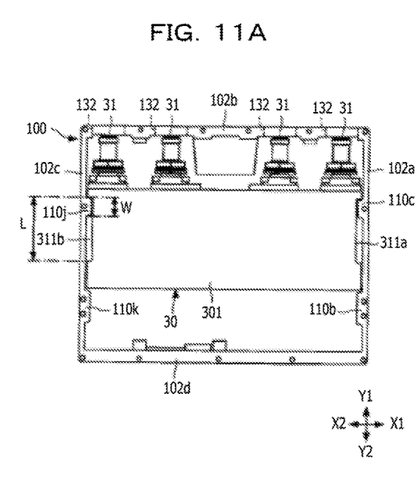
FIGS. 11A and 11B illustrate how connectors of the duplexer are inserted into openings provided in a cover portion.
Figure 11B:
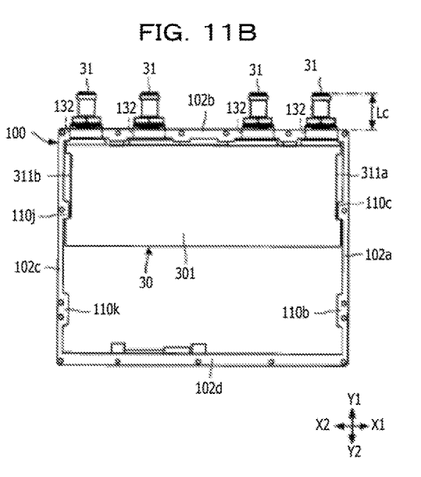

FIGS. 11A and 11B illustrate how the connectors 31 of the duplexer 30 are inserted into openings 132 provided in the second sidewall 102b of the cover portion 100. FIG. 11A illustrates a state before the connectors 31 of the duplexer 30 are inserted into the openings 132. FIG. 11B illustrates a state after the connectors 31 of the duplexer 30 are inserted into the openings 132.

To insert the connectors 31 of the duplexer 30 into the openings 132, referring to FIG. 11A, the duplexer 30 is first placed in the cover portion 100 such that the connectors 31 faces the openings 132. Then, as illustrated in FIG. 11B, the duplexer 30 is moved in the Y1 direction, whereby the connectors 31 are inserted into the openings 132. The connectors 31 project from the openings 132 of the second sidewall 102b in the Y1 direction that is parallel to the first sidewall 102a and the third sidewall 102c.

The connectors 31 inserted into the openings 132 are secured to the second sidewall 102b. Thus, the duplexer 30 is attached to the cover portion 100. The cover portion 100 now having the duplexer 30 is fastened to the base portion 200 on which the substrate 40, the power-source unit 45, and so forth are mounted.

As illustrated in FIGS. 11A and 11B, the recess 110c is depressed from the first sidewall 102a toward the inner side in such a manner as to conform to the cut 311a of the duplexer 30. The recess 110j of the fourth sidewall 102d is depressed from the third sidewall 102c toward the inner side in such a manner as to conform to the cut 311b of the duplexer 30.

The cuts 311a and 311b of the duplexer 30 and the recesses 110c and 110j of the cover portion 100 are shaped in such a manner as not to interfere with each other before and after the connectors 31 are inserted into the openings 132.

As illustrated in FIGS. 11A and 11B, the cuts 311*a* and 311*b* of the duplexer 30 are each shaped such that a length L thereof in the Y1 direction in which the connectors 31 project is longer than or equal to the sum of a width W of a corresponding one of the recesses 110*c* and 110*j* of the cover portion 100 and a length of projection Lc of each of the connectors 31 from a corresponding one of the openings 132. In such a configuration, the connectors 31 can be inserted into the openings 132 by moving the duplexer 30 along the first sidewall 102*a* and the third sidewall 102*c* of the cover portion 100.

Figure 12:
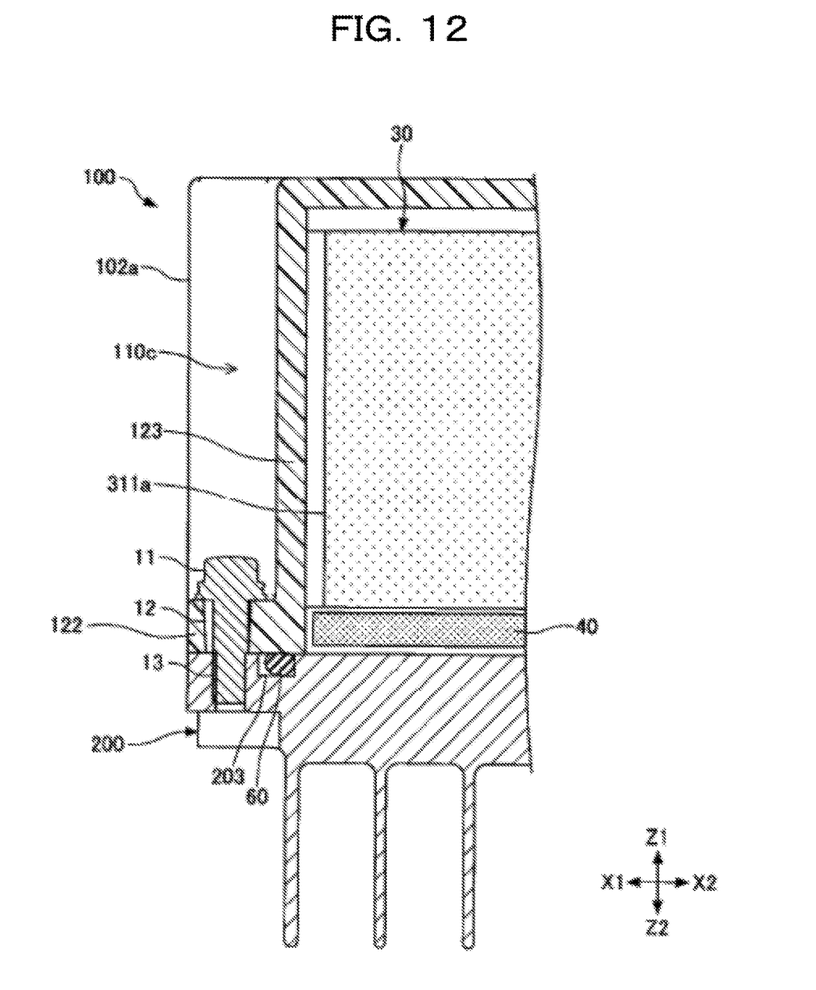
FIG. 12 is a sectional view of a part of the electronic apparatus according to the embodiment.

FIG. 12 is a sectional view of a part of the electronic apparatus 1 according to the embodiment and illustrates an X-Z section of the cover portion 100 that passes through the recess 110*c* provided in the first sidewall 102*a*.

The recess 110*c* is depressed from the first sidewall 102*a* toward the inner side in such a manner as to conform to the cut 311*a* of the duplexer 30. The screw 11 is inserted into the insertion hole 12 provided in the bottom wall 122 of the recess 110*c* and is screwed into the screw hole 13 provided at the peripheral edge of the base portion 200, whereby the cover portion 100 is fastened to the base portion 200.

The gasket 60 fitted in the gasket groove 203 of the base portion 200 elastically deforms when pressed by the cover portion 100 fastened to the base portion 200, thereby tightly sealing the gap between the cover portion 100 and the base portion 200.

As described above, the cover portion 100 is fastened to the base portion 200 with the screws 11 at the recess 110*c* that is depressed from the first sidewall 102*a* toward the inner side in such a manner as to conform to the cut 311*a* of the duplexer 30 and at the recess 110*j* that is depressed from the third sidewall 102*c* toward the inner side in such a manner as to conform to the cut 311*b* of the duplexer 30.

Since the cuts 311*a* and 311*b* are provided in the side faces of the duplexer 30 as described above, the recesses 110*c* and 110*j* where the cover portion 100 is fastened to the base portion 200 can be provided on the inner side with respect to the outer peripheral surfaces of the first sidewall 102*a* and the third sidewall 102*c*. Furthermore, as with the case of the recesses 110*c* and 110*j*, the cover portion 100 is fastened to the base portion 200 at the recesses 110*b* and 110*k* that are depressed from the first sidewall 102*a* and the third sidewall 102*c*, respectively, toward the inner side.

Hence, in the electronic apparatus 1 according to the embodiment, flanges or the like that project from the first sidewall 102*a* and the third sidewall 102*c* toward the outer side so as to allow the cover portion 100 to be fastened to the base portion 200 do not have to be provided. Therefore, the electronic apparatus 1 can be made smaller with a reduction in the width of the housing 10 by the size of such flanges than the electronic apparatus 5 illustrated in FIGS. 1 to 4.

Moreover, the sidewalls 102 of the cover portion 100 have increased strength because the recesses 110 function as ribs. Hence, according to the embodiment, the sidewalls 102 of the cover portion 100 can be provided with satisfactory strength without providing ribs or the like in addition to the recesses 110.

To summarize, the electronic apparatus 1 according to the embodiment has a reduced size with the housing 10 having a reduced width in the X1-X2 direction. Furthermore, since the recesses 110 are provided in the sidewalls 102, the sidewalls 102 have increased strength.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic apparatus comprising:
   a housing that houses an electronic component; and
   a first cover and a second cover that cover the housing,
   wherein the electronic component is oriented along and on an inner side of a first sidewall of the first cover,
   wherein a side surface of the electronic component that faces the first sidewall has a cut,
   wherein the first cover has a recess that is depressed from the first sidewall toward the inner side in such a manner as to conform to the cut,
   wherein the first cover is fastened at the recess to the second cover with a fastening member,
   wherein the electronic component includes a connector that projects from an opening provided in a second sidewall of the first cover and in a direction parallel to the first sidewall, and
   wherein the cut has a length, in a direction of projection of the connector, greater than or equal to a sum of a width of the recess and a length of projection of the connector from the opening.

2. The electronic apparatus according to claim 1, wherein the recess includes
   a bottom wall that extends from the first sidewall toward the inner side of the first cover and is fastened to the second cover with the fastening member, and
   a peripheral wall that extends from a peripheral edge of the bottom wall and perpendicularly to the bottom wall.

3. The electronic apparatus according to claim 1, wherein the second cover is a heat sink that includes a plurality of heat-radiating fins.

4. The electronic apparatus according to claim 1, further comprising:
   a seal member that seals a gap between the first cover and the second cover.

* * * * *